US011417026B2

(12) United States Patent
Yoo

(10) Patent No.: US 11,417,026 B2
(45) Date of Patent: Aug. 16, 2022

(54) OPERATING METHOD OF IMAGE PROCESSOR WITH VARYING PACKING DIRECTIONS, IMAGE PROCESSING APPARATUS WITH VARIED PACKING DIRECTIONS, AND OPERATING METHOD OF THE IMAGE PROCESSING APPARATUS WITH THE VARIED PACKING DIRECTIONS

(71) Applicant: SAMSUNG ELECTRONICS CO., LTD., Suwon-si (KR)

(72) Inventor: Junhee Yoo, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 16 days.

(21) Appl. No.: 17/034,236

(22) Filed: Sep. 28, 2020

(65) Prior Publication Data
US 2021/0209805 A1 Jul. 8, 2021

(30) Foreign Application Priority Data

Jan. 6, 2020 (KR) ........................ 10-2020-0001578

(51) Int. Cl.
G06T 9/00 (2006.01)
G06T 7/11 (2017.01)
H03M 7/30 (2006.01)

(52) U.S. Cl.
CPC ................. *G06T 9/00* (2013.01); *G06T 7/11* (2017.01); *H03M 7/30* (2013.01); *G06T 2207/20021* (2013.01)

(58) Field of Classification Search
CPC .... G06T 9/00; G06T 1/60; G06T 7/11; H04N 19/176; G06F 12/02; G06F 12/00; G06K 9/36
See application file for complete search history.

(56) References Cited

U.S. PATENT DOCUMENTS

| 6,825,847 B1 | 11/2004 | Molnar et al. |
| 8,873,876 B2 | 10/2014 | Uchiyama |
| 9,086,951 B2 | 7/2015 | Tagami et al. |
| 9,177,393 B2 | 11/2015 | Teng et al. |
| 9,299,166 B2 | 3/2016 | Lachine et al. |
| 9,509,992 B2 | 11/2016 | Komi et al. |

(Continued)

OTHER PUBLICATIONS

AFBC (Arm Frame Buffer Compression) (https://www.arm.com/why-arm/technologies/graphics-technologies/arm-frame-buffer-compression).

*Primary Examiner* — Li Liu
(74) *Attorney, Agent, or Firm* — Volentine, Whitt & Francos, PLLC

(57) ABSTRACT

An operating method of an image processor includes dividing image data into a plurality of data blocks and compressing each of the plurality of data blocks. The operating method also includes determining a packing direction as a determined packing direction, in which a corresponding compressed data block of a plurality of compressed data blocks is to be stored, based on a data size of the corresponding compressed data block and a start address of a storage area where the corresponding compressed data block is to be stored among a plurality of storage areas of a memory. Each of the plurality of compressed data blocks is packed in a corresponding storage area among the plurality of storage areas of the memory based on the determined packing direction.

20 Claims, 22 Drawing Sheets

(56) References Cited

U.S. PATENT DOCUMENTS

| | | |
|---|---|---|
| 10,158,870 B2 | 12/2018 | Jeong et al. |
| 2002/0159656 A1* | 10/2002 | Matsuki .................... G06T 1/60 |
| | | 382/305 |
| 2005/0125624 A1* | 6/2005 | Rose .................. G06F 9/30112 |
| | | 711/201 |
| 2006/0271761 A1 | 11/2006 | Riemens |
| 2008/0282057 A1* | 11/2008 | Layden ................ G06F 16/289 |
| | | 711/210 |
| 2020/0183848 A1* | 6/2020 | Loh .................... G06F 12/0862 |

* cited by examiner

<Packing Left>

<Packing Right>

<Packing Left>

<Packing Right>

OPERATING METHOD OF IMAGE PROCESSOR WITH VARYING PACKING DIRECTIONS, IMAGE PROCESSING APPARATUS WITH VARIED PACKING DIRECTIONS, AND OPERATING METHOD OF THE IMAGE PROCESSING APPARATUS WITH THE VARIED PACKING DIRECTIONS

CROSS-REFERENCE TO RELATED APPLICATION

This U.S. nonprovisional patent application claims priority under 35 U.S.C. § 119 to Korean Patent Application No. 10-2020-0001578, filed on Jan. 6, 2020 in the Korean Intellectual Property Office, the disclosure of which is incorporated herein in its entirety by reference.

BACKGROUND

1. Technical Field

The inventive concept(s) described herein relate to a semiconductor device for performing image processing. More particularly, the inventive concept(s) described herein relate to an image processor for compressing image data to store compressed image data in a memory, an operating method of the image processor, and an operating method of an image processing apparatus that includes the image processor.

2. Discussion of the Related Art

Increasing demand for high-resolution video images and high frame rate images has resulted in considerable increases in the amount of data to be stored in memories of image processing apparatuses and the number of accesses to memories of the image processing apparatuses. For example, the memories of image processing apparatuses may be accessed at increasing amounts by a plurality of unique multimedia circuits or devices which are sometimes referred to as, for example, intellectual properties (IPs), IP blocks and IP devices. The increasing accesses may reflect increasing averages of accesses per image processing apparatus, increasing ranges of frequencies of accesses over periods of time and for multiple image processing apparatuses, as well as other metrics. When the amount of data to be stored in the memories of an image processing apparatus increases or the number of accesses to a memory of an image processing apparatus increases, the processing performance of the image processing apparatus may approach or reach a limit. As a result, a speed of performing a recording operation and a reproduction operation on a video image in/by the image processing apparatus may be reduced. Therefore, mechanisms for compressing a size of data are being developed for multimedia IP access to memories of image processing apparatuses. For example, data may be compressed before writing the data in a memory, and the compressed data may be decompressed after the compressed data is read from the memory.

SUMMARY

The inventive concept(s) described herein provide an image processor, an operating method thereof, and an operating method of an image processing apparatus which includes the image processor. The inventive concept(s) described herein reduce power consumption and a number of accesses to a memory in compressing image data and storing compressed image data in the memory.

According to an aspect of the inventive concept(s) described herein, an operating method of an image processor includes dividing image data into a plurality of data blocks and compressing each of the plurality of data blocks. The operating method of the image processor further includes determining a packing direction as a determined packing direction in which a corresponding compressed data block of a plurality of compressed data blocks is to be stored, based on a data size of the corresponding compressed data block and a start address of the storage area where the corresponding compressed data block is to be stored among a plurality of storage areas of a memory. The operating method of the image processor also includes packing each of the plurality of compressed data blocks in a corresponding storage area among the plurality of storage areas of the memory based on the determined packing direction.

According to another aspect of the inventive concept(s) described herein, an image processing apparatus includes a memory and an image processor. An operating method of the image processing apparatus includes compressing, by the image processor, a first data block of a plurality of data blocks included in image data to generate a first compressed data block and determining, by the image processor, a packing direction of the first compressed data block based on a data size of the first compressed data block and a start address of a first storage area allocated for the first compressed data block among a plurality of storage areas of the memory. The operating method of the image processing apparatus further includes storing, by the memory, the first compressed data block to the left or the right of the first storage area based on the packing direction.

According to another aspect of the inventive concept(s) described herein, an image processing apparatus includes a compressor and a packing controller. The compressor is configured to divide image data into a plurality of data blocks and compress each of the plurality of data blocks. The packing controller is configured to write each of a plurality of compressed data blocks in a corresponding storage area of a plurality of storage areas in a memory and to determine a packing direction as a determined packing direction so that a corresponding compressed data block is packed in the determined packing direction to the left of the storage area or to the right of a corresponding storage area, based on a data size of the corresponding compressed data block and a start address of the corresponding storage area where the corresponding compressed data block is to be stored.

BRIEF DESCRIPTION OF THE DRAWINGS

Embodiments of the inventive concept(s) described herein will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
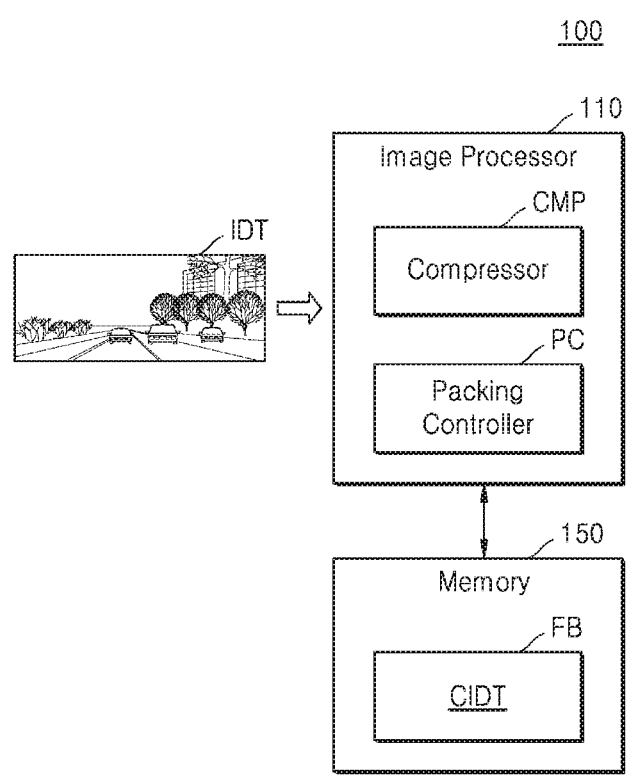
FIG. 1 is a block diagram illustrating an image processing apparatus according to an embodiment.

FIG. 1 is a block diagram illustrating an image processing apparatus 100 according to an embodiment.

Referring to FIG. 1, the image processing apparatus 100 may include an image processor 110 and a memory 150. The image processing apparatus 100 may further include other general-use elements, and for example, may further include an imaging module (not shown in FIG. 1) for generating image data IDT and/or a display module (not shown in FIG. 1) for displaying the image data IDT.

The image processing apparatus 100 may be equipped in various electronic devices for generating, processing, and displaying the image data IDT. For example, the image processing apparatus 100 may be equipped in electronic devices such as laptop computers, smart televisions (TVs), smartphones, tablet personal computers (PCs), personal digital assistants (PDAs), enterprise digital assistants (EDAs), digital cameras, portable multimedia players (PMPs), portable navigation devices (PNDs), handheld game consoles, mobile internet devices (MIDs), multimedia devices, Internet of things (IoT) devices, Internet of everything (IoE) devices, and e-books.

The image processor 110 may receive the image data IDT, perform image processing on the received image data IDT, and store image-processed data IDT in the memory 150. Also, the image processor 110 may read all or a portion of the image data IDT stored in the memory 150 and may perform image processing on all or a portion of the read image data IDT.

The image processor 110 may compress the image data IDT to generate compressed image data CIDT and may store the compressed image data CIDT in the memory 150 (in detail, a frame buffer FB included in the memory 150), for decreasing a number of accesses of the memory 150. In this case, a size of the frame buffer FB may be the same as a size of the image data IDT.

The image processor 110 may be implemented as hardware, software, or a combination thereof, such as a central processing unit (CPU), a graphics processing unit (GPU), or an image signal processor (ISP) for performing image processing. In an embodiment, the image processor 110 may be implemented as a system on chip (SoC) included in an imaging device or a mobile device. A SoC may be a single, integrated circuit provided as a single chip such that all components are physically connected directly or indirectly to one another on a single substrate. A SoC may be a device that is installed as a component in another device. A SoC may include all components of, for example, an electronic system or sub-system The image processor 110 may include a compressor CMP and a packing controller PC. The compressor CMP and the packing controller PC may each be implemented as a function module based on hardware, software, or a combination thereof.

The compressor CMP may divide the image data IDT into a plurality of data blocks and may compress each of the plurality of data blocks. Therefore, a plurality of compressed data blocks (i.e., the compressed image data CIDT) may be generated. The compressor CMP may encode each of the plurality of data blocks based on a predetermined encoding mechanism (e.g., protocol, algorithm, standard etc.) to generate the plurality of compressed data blocks. Also, when at least one compressed data block is read from the memory 150, the compressor CMP may decode the at least one compressed data block based on a predetermined decoding mechanism to decompress the at least one compressed data block.

When each of the plurality of compressed data blocks is stored in a corresponding storage area of a plurality of storage areas of the memory 150, the packing controller PC may determine a packing direction representing whether a corresponding compressed data block is packed to the right or the left of the corresponding storage area. As explained below with respect to FIG. 4A and FIG. 4B, for example, a "packing direction" may refer to a direction in which data is stored in a corresponding storage area. In this context, when the packing direction of a compressed data block is to the left, the compressed data block may be stored on the left side of the corresponding storage area. When the packing direction of a compressed data block is to the right, the compressed data block may be stored on the right side of the corresponding storage area. Additionally, the left side of a storage area and the right side of a storage area may be opposing sides of the storage area, and writing or reading may start, for example, at an extremity of the storage area on a specified left side or a specified right side and end closer to the middle of the storage area. However, the inventive concept(s) are not limited thereto, and when the packing direction of a compressed data block is to the right, the writing or reading may start, for example, at closer to the middle of the storage area and end an extremity of the storage area on a specified right side. The left side of a storage area may alternatively refer to a first side of the storage area, and the right side of the storage area may alternatively refer to a second side of the storage area opposite the first side. The packing controller PC may pack each of the plurality of compressed data blocks in a corresponding storage area based on the determined packing direction. In other words, the packing controller PC may control the memory 150 so that each of the plurality of compressed data blocks is stored in a packing direction to the right (on the right side) or to the left (on the left side) of a corresponding storage area.

The plurality of storage areas may be areas allocated to the memory 150, for respectively storing the plurality of data blocks and may configure the frame buffer FB. The number of storage areas may be the same as the number of data blocks. A data size of each storage area may be the same as a data size of each data block. For example, the amount of data stored in each storage area may be the same as the amount of data in each data block. A start address of each of the plurality of storage areas may be determined based on a size of the image data IDT and a size of each of the plurality of data blocks. For example, a start address of each of the plurality of storage areas may be determined based on a total size of the plurality of storage areas which is a size of the frame buffer FB, as well on as a size of each of the plurality of storage areas.

A size of a compressed data block to be actually stored in a storage area may be less than a size (e.g., capacity) of the storage area. For example, when a compression rate of the compressed data block is not 0%, the size of the compressed data block to be stored may be less than a size of the storage area. When the compressed data block is not compressed so that the compression rate is 0%, the size of the compressed data block may be the same as that of the storage area. The packing controller PC may determine a packing direction so that a compressed data block is packed to the right or to the left of a storage area. For example, when a packing direction is determined to be the left, a compressed data block may be stored on the left side of the corresponding storage area from a point represented by a start address of a storage area. As a result, the compressed data block may be packed on the left side of the storage area. Also, when the packing direction is determined to be the right, the compressed data block may be stored on the right side of the corresponding storage area from a point represented by an end address of the storage area or a middle address of the storage area. As a result, the compressed data block may be packed on the right side of the storage area.

The packing controller PC may determine a packing direction of each of the plurality of compressed data blocks based on a size of a corresponding data block (or a size of a corresponding storage area), an access unit of the memory 150, a start address of the corresponding storage area, and/or a size of a corresponding compressed data block. In this case, the access unit for accessing the memory 150 may be a minimum unit of write or a minimum unit of read when writing data in the memory 150 or reading the data from the memory 150. A method of determining a packing direction as a determined packing direction will be described below in detail with reference to FIG. 7 to FIG. 10B.

The memory 150 may store compressed image data, and moreover, may store data obtained through processing by the image processor 110, data generated by the image processing apparatus 100, or data (for example, image data) received from the outside. The memory 150 may store (write) or read data by an access unit.

The memory 150 may be implemented as a volatile memory or a non-volatile memory. A volatile memory as the memory 150 may include dynamic random access memory (RAM) (DRAM), static RAM (SRAM), etc., and a non-volatile memory as the memory 150 may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc.

When data is stored in the memory 150 or when data is read from the memory 150, the number of accesses of the memory 150 for storing or reading the data may be determined based on an access unit. When a size of a data block (i.e., a size of a storage area) is not an integer multiple of an access unit of the memory 150, the number of accesses for storing a compressed data block in a storage area (or for reading the compressed data block from the storage area) may vary based on a packing direction of the compressed data block. The image processing apparatus 100 according to an embodiment may selectively determine a packing direction of a compressed data block as the left or the right, thereby decreasing the number of accesses of the memory 150. Therefore, a number of accesses of the memory 150 may be reduced, and a processing speed of the image processing apparatus 100 may increase and power consumption of the image processing apparatus 100 may be reduced.

In FIG. 1, the image processor 110 is illustrated as including the compressor CMP and the packing controller PC, but the image processor 110 is not limited thereto and the compressor CMP and the packing controller PC may be included in the image processing apparatus 100 as separate modules.

Figure 2:
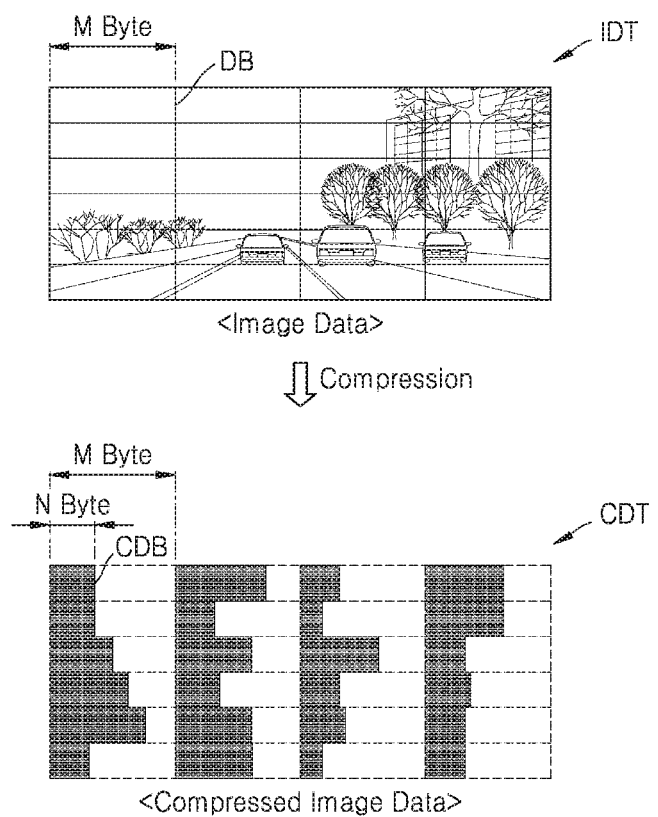
FIG. 2 illustrates a method of compressing image data, according to an embodiment.

FIG. 2 illustrates a method of compressing image data, according to an embodiment.

Referring to FIG. 1 and FIG. 2, the compressor CMP may divide image data IDT into a plurality of data blocks DB and may compress each of the plurality of data blocks DB. A size of each of the plurality of data blocks DB may be M (where M is a positive integer) bytes. Additionally, each of the plurality of data blocks DB may be the same size. In FIG. 1, the image data IDT is illustrated as being divided into twelve data blocks, but this is merely for convenience of description. In other embodiments, the number of data blocks DB may be changed based on a data size of the image data IDT and the performance of the image processing apparatus 100. In more detail, in other embodiments the performance of the image processing apparatus may include the performance of the compressor CMP.

The compressor CMP may encode each of the plurality of data blocks DB of the divided image data IDT based on a predetermined encoding mechanism, thereby generating a plurality of compressed data blocks CDB. The compressor CMP may compress each of the twelve data blocks DB of the image data IDT to generate twelve compressed data blocks CDB. A data size of each data block DB may be M (where M is a positive integer) bytes, and a data size of each compressed data block CDB may be N (where N is a positive integer equal to or less than M) bytes. Compression rates of the plurality of data blocks DB may vary. For example, when a size of a data block is 224 bytes and a compression rate thereof is 50%, a data size of a corresponding compressed data block CDB may be 112 bytes. When a compression rate is 0%, a data size of a corresponding compressed data block CDB may be 224 bytes, i.e., the same size as the original data block.

Figure 3:
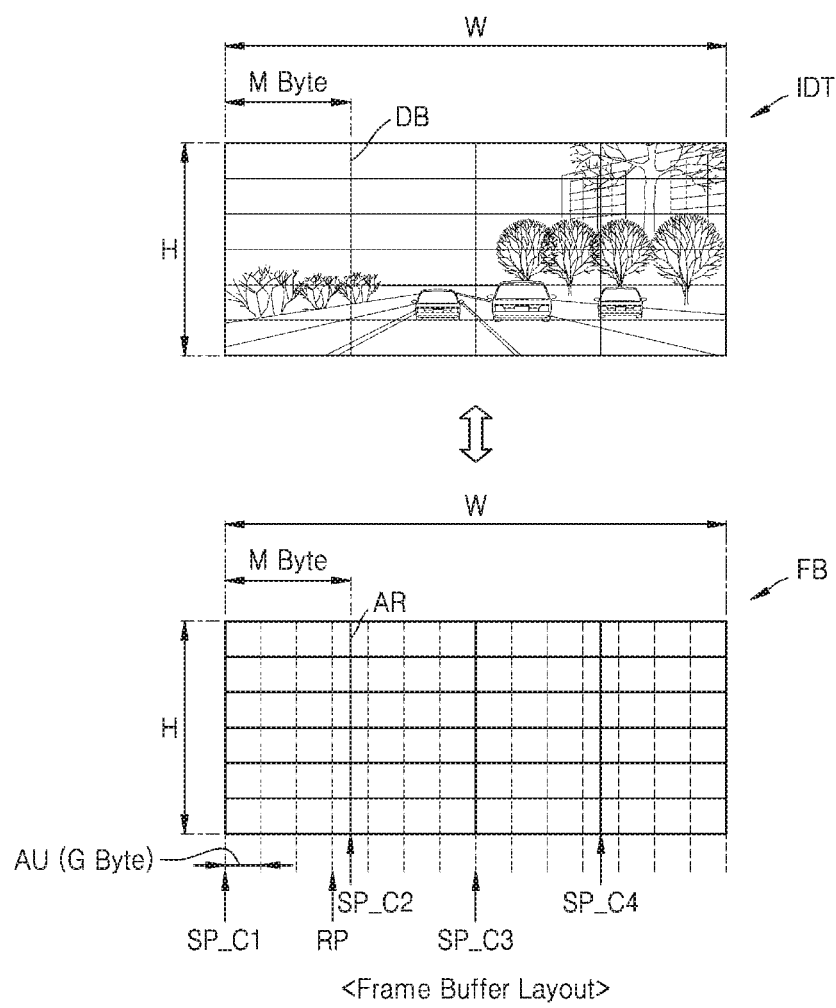
FIG. 3 illustrates a layout of a frame buffer according to an embodiment.

FIG. 3 illustrates a layout of a frame buffer according to an embodiment.

Referring to FIG. 1 and FIG. 3, the memory 150 may include a frame buffer FB having a size corresponding to a size (a height H and a width W) of image data IDT, and the frame buffer FB may include a plurality of storage areas AR. The plurality of storage areas AR may respectively correspond to a plurality of data blocks DB of the image data IDT, and a data size of each of the storage areas AR may be the same as a data size of a corresponding data block DB. For example, a data size of each data block DB may be M bytes, and a size of each storage area AR may be M bytes.

The frame buffer FB may be accessed based on an access unit AU for accessing the memory 150. For example, the access unit AU (i.e., memory access granularity) may be G (where G is a positive integer equal to or less than M) bytes, and the access unit AU may be less than a size of each data block DB (i.e., M bytes).

When a size of each data block DB is not an integer multiple of the access unit AU, as illustrated in FIG. 3, a position of each of the plurality of storage areas AR may not match a reference position (a dot-illustrated position) RP of the frame buffer FB based on the access unit AU. For example, when a size of each data block DB is not an integer multiple of the access unit AU, an alignment location of a start address or an end address of each of the plurality of storage areas AR may not match a reference position RP of the frame buffer FB. As a more detailed example, when a data size of each data block DB is 224 bytes and the access unit AU is 64 bytes, start addresses SP_C1 and SP_C3 of storage areas placed in a first column and a third column among the plurality of storage areas AR may match the reference position RP of the frame buffer FB, but start addresses SP_C2 and SP_C4 of storage areas placed in a second column and a fourth column may not match the reference position RP.

As described above, when a size of a data block (i.e., a size of a storage area) is not an integer multiple of the access unit AU, the number of accesses for storing the compressed data block in a storage area (or for reading the compressed data block from the storage area) may vary based on a packing direction of the compressed data block. The packing controller PC may select a packing direction of a compressed data block from among the left and the right, and the compressed data block may be packed (stored) in the memory 150 based on the selected packing direction.

Figure 4A:
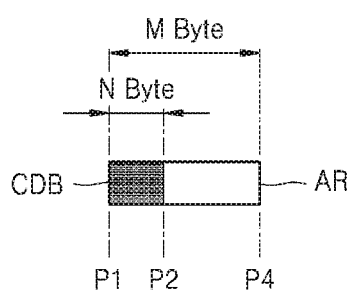
FIG. 4A and FIG. 4B illustrate a method of packing a compressed data block according to an embodiment.
Figure 4B:
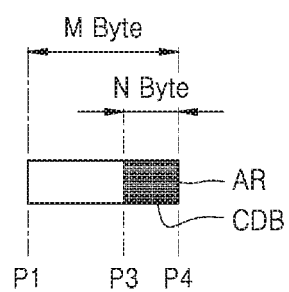

FIG. 4A and FIG. 4B illustrate a method of packing a compressed data block according to an embodiment.

Referring to FIG. 4A, a compressed data block CDB may be packed on the left side of a storage area AR. When a packing direction is determined to be to the left as in FIG. 4A, the compressed data block CDB may be stored on the left side of the storage area AR from a first point P1, represented by a start address of the storage area AR, to a second point P2. In this case, the second point P2 may be a point which is apart from the first point P1 to the right by a data size (for example, N bytes) of the compressed data block.

Referring to FIG. 4B, a compressed data block CDB may be packed on the right side of a storage area AR. When a packing direction is determined to be to the right as in FIG. 4B, the compressed data block CDB may be stored from a third point P3 to a fourth point P4, represented by an end address of the storage area AR. In this case, the third point P3 may be a point which is apart from the fourth point P4 to the left by a data size (for example, M bytes) of the compressed data block CDB.

Referring to FIG. 4B in conjunction with FIG. 1, in a case where a plurality of compressed data blocks CD are provided to the memory 150 so as to write the compressed data blocks CD, the packing controller CP may provide the memory 150 with a storage address representing the first point P1, a storage address representing the second point P2 (not shown in FIG. 4B), a storage address representing the third point P3 and/or a storage address representing the fourth point P4 based on a packing direction corresponding to each of a plurality of compressed data blocks CD. Each of the plurality of compressed data blocks CD may be packed to the right (from left to right) or to the left (from right to left) of a corresponding storage area AR based on a storage address. That is, when the packing controller CP provides the memory 150 with a storage address as the starting address, the packing direction will be the direction from the starting address to the ending address.

Figure 5:
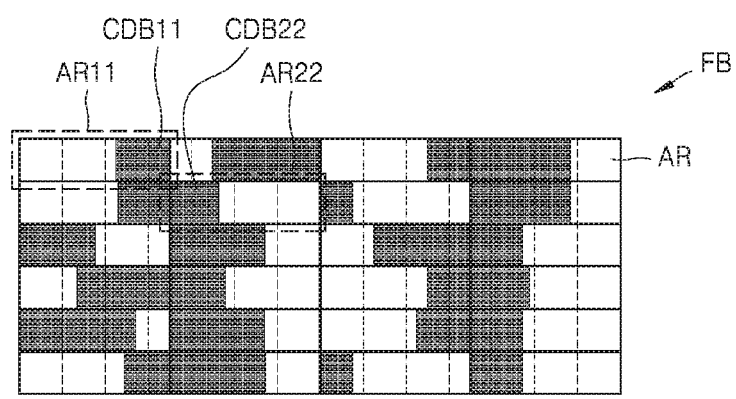
FIG. 5 illustrates an example where compressed image data is stored in a frame buffer, according to an embodiment.

FIG. 5 illustrates an example where compressed image data is stored in a frame buffer, according to an embodiment.

Referring to FIG. 5, as a plurality of compressed data blocks CDB are packed to the right (on the right side) or to the left (on the left side) of a plurality of storage areas AR of a frame buffer FB, compressed image data corresponding to one frame may be stored in the frame buffer FB.

For example, a compressed data block CDB11 corresponding to a storage area AR11 placed in a first column of a first row of the frame buffer FB may be packed on the right side of the storage area AR11. A compressed data block CDB22 corresponding to a storage area AR22 placed in a second column of a second row of the frame buffer FB may be packed on the left side of the storage area AR22. That is, the compressed data block CDB11 is packed on the right side of the storage area AR11, with a packing direction to the right. The compressed data block CDB22 is packed on the left side of the storage area AR22, with a packing direction to the left.

Figure 6:
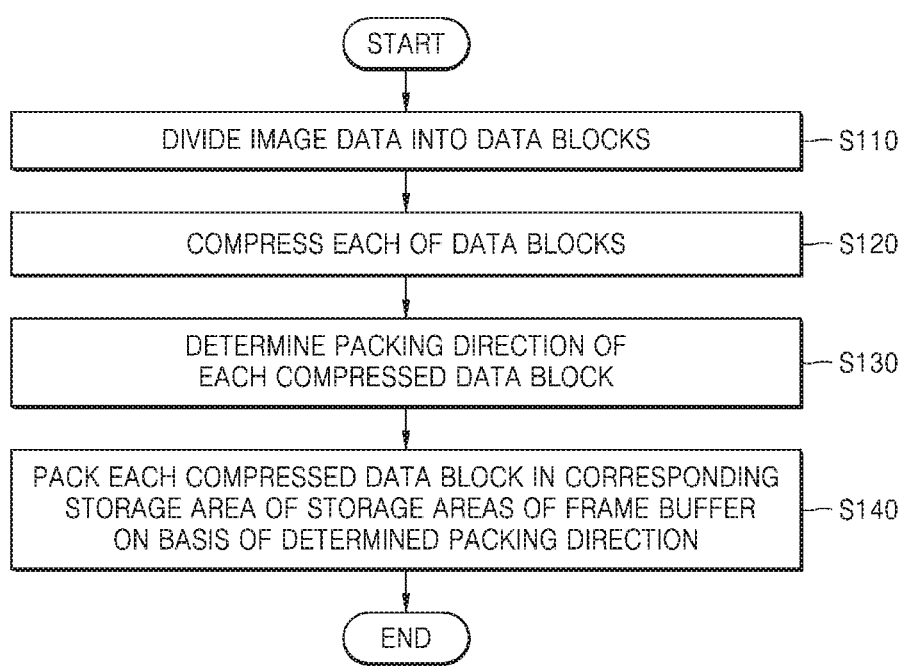
FIG. 6 is a flowchart illustrating an operating method of an image processing apparatus according to an embodiment.

FIG. 6 is a flowchart illustrating an operating method of an image processing apparatus according to an embodiment. FIG. 6 illustrates a packing method of packing, by an image processing apparatus, image data in a frame buffer. The method of FIG. 6 may be performed by the image processor 110 of FIG. 1, and the description given above with reference to FIG. 1 may be applied to the present embodiment.

Referring to FIG. 1 and FIG. 6, the image processor 110 may divide image data IDT into a plurality of data blocks in operation S110 and may compress each of the plurality of data blocks in operation S120. For example, the compressor CMP may encode each of the plurality of data blocks based on a predetermined encoding mechanism. Therefore, a plurality of compressed data blocks may be generated.

The image processor 110 may determine a packing direction corresponding to each of the plurality of compressed data blocks in operation S130. For example, the packing controller PC may determine a packing direction for when a compressed data block is stored in a corresponding storage area, based on a data size of the compressed data block and a start address of the corresponding storage area where the compressed data block is to be stored. The packing direction of each compressed data block may be determined independently, so that different compressed data blocks may be packed in different packing directions.

The image processor 110 may pack each of the plurality of compressed data blocks in a corresponding storage area among a plurality of storage areas of a frame buffer based on the determined packing direction in operation S140. In an embodiment, the packing controller PC may generate a storage address based on the determined packing direction for each of a plurality of compressed data blocks. When transmitting the plurality of compressed data blocks to the memory 150 so as to write the compressed data blocks, the packing controller PC may transmit the plurality of compressed data blocks to the memory 150 along with a plurality of storage addresses corresponding to the plurality of compressed data blocks. The packing may involve transmitting the start address or a middle address (calculated when the right is selected as the packing direction) to the memory 150 based on the packing direction. The middle address may be calculated based on a size of the storage area, a size of the corresponding compressed data block and the end address of the storage area when the right is selected as the packing direction. Each of the plurality of compressed data blocks may be packed to the right (on the right side) or to the left (on the left side) of a corresponding storage area based on the plurality of storage addresses, and thus, may be stored.

Figure 7:
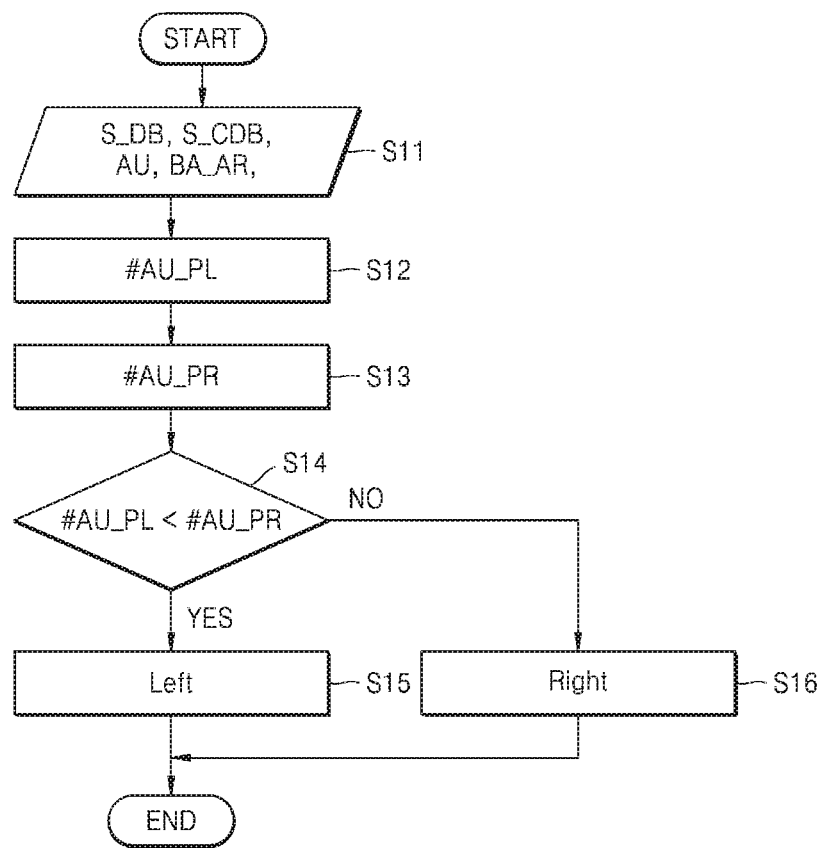
FIG. 7 is a flowchart illustrating a method of determining a packing direction of an image processing apparatus according to an embodiment.
Figure 8A:
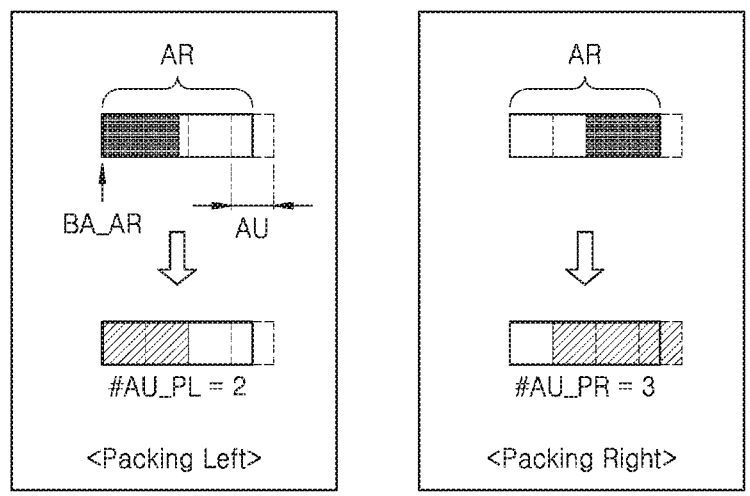
FIG. 8A and FIG. 8B illustrate the number of memory accesses based on a packing environment.
Figure 8B:
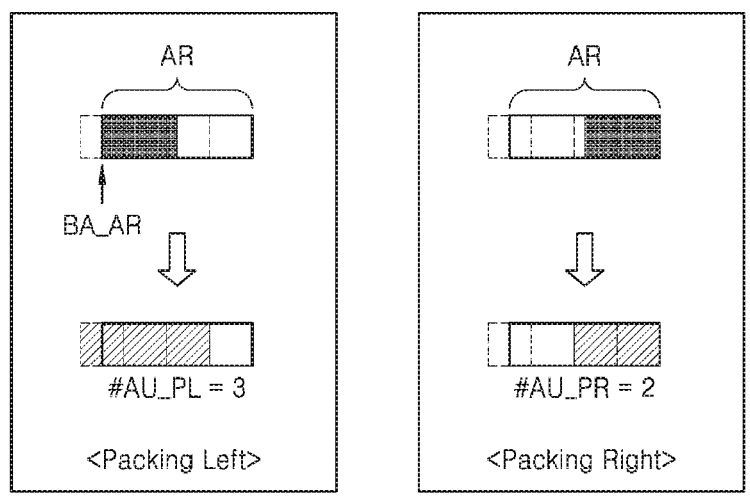

FIG. 7 is a flowchart illustrating a method of determining a packing direction of an image processing apparatus according to an embodiment. FIG. 8A and FIG. 8B illustrate the number of memory accesses based on a packing environment. The method of FIG. 7 may be performed by the packing controller PC of FIG. 1.

Referring to FIG. 1 and FIG. 7, in operation S11, the packing controller PC may receive information about a packing environment. As shown in S11, the information about the packing environment received by the packing controller PC may include, for example, a size S_DB of a data block, an access unit AU for accessing the memory 150, a size S_CDB of a compressed data block, and a start address BA_AR (referred to also as a base address) of a storage area where the compressed data block is to be stored. For example, the size S_DB of the data block, the access unit AU, and the start address BA_AR of the storage area may be stored in the image processor 110, and the packing controller PC may check the size S_DB of the data block, the access unit AU, and the start address BA_AR of the storage area. The size S_CDB of the compressed data block may vary for each of a plurality of compressed data blocks and may vary for each frame of image data IDT. For example, the size S_CDB of the compressed data block and/or the size of image data IDT may vary based on an image processing state. The packing controller PC may receive the size S_CDB of the compressed data block from the compressor CMP.

Based on the information about the packing environment, the packing controller PC may calculate a first number of accesses #AU_PL of the memory 150, which are or will be needed when packing a corresponding compressed data block to the left of (on the left side) of a storage area in operation S12, and may calculate a second number of accesses #AU_PR of the memory 150, which are or will be needed when packing the corresponding compressed data block to the right of (on the right side) of the storage area in operation S13. The packing controller PC may calculate the first number of accesses #AU_PL and the second number of accesses #AU_PR based on the size S_DB of the data block, the access unit AU, the start address BA_AR of the storage area, and the size S_CDB of the compressed data block.

Referring to FIG. 8A and FIG. 8B, a case where a size S_DB of a data block is 3.5 times an access unit AU and a size S_CDB of a compressed data block is 1.8 times the access unit AU may be assumed. As illustrated in FIG. 8A, in a case where an alignment location of a start address BA_AR of a storage area matches a reference position of the memory 150, a first number of accesses #AU_PL when packing a compressed data block SCB on the left side of a storage area AR may be 2 and a second number of accesses #AU_PR when packing a compressed data block SCB on the right side of the storage area AR may be 3.

As illustrated in FIG. 8B, an alignment location of a start address BA_AR of a storage area does not match a reference position of the memory 150. A mismatch as shown in FIG. 8B may occur, for example, when the alignment location is a middle point between reference positions. In FIG. 8B, a first number of accesses #AU_PL when packing a compressed data block SCB on the left side of a storage area AR may be 3 and a second number of accesses #AU_PR when packing a compressed data block SCB on the right side of the storage area AR may be 2.

Referring again to FIG. 7, the packing controller PC may compare the first number of accesses #AU_PL with the second number of accesses #AU_PR to determine whether the first number of accesses #AU_PL is less than the second number of accesses #AU_PR in operation S14. When the first number of accesses #AU_PL is less than the second number of accesses #AU_PR, the packing controller PC may determine the packing direction of the compressed data block to be to the left in operation S15. The compressed data block may be stored on the left side of a storage area AR. When the first number of accesses #AU_PL is equal to or greater than the second number of accesses #AU_PR, the packing controller PC may determine the packing direction of the compressed data block to be to the right in operation S16. The compressed data block may be stored on the right side of a storage area AR. As described above, the packing controller may determine the packing direction based on a direction in which the number of accesses to the memory 150 based on an access unit of the memory 150 is relatively small.

Figure 9:
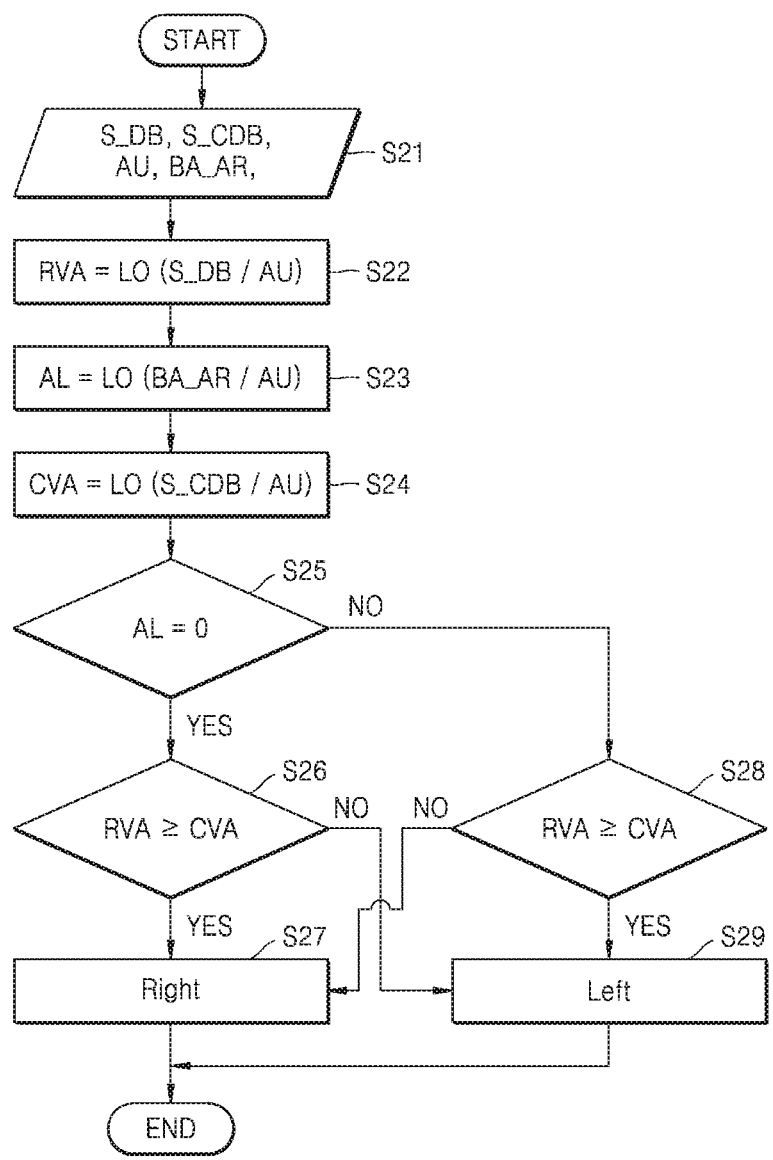
FIG. 9 is a flowchart illustrating a method of determining a packing direction of an image processing apparatus according to an embodiment.
Figure 10A:
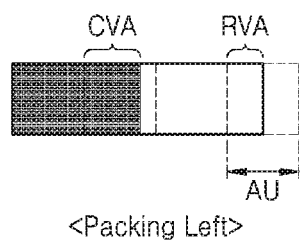
FIG. 10A and FIG. 10B illustrate the number of memory accesses based on a packing environment.
Figure 10A:
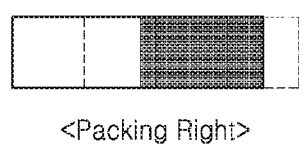
Figure 10B:
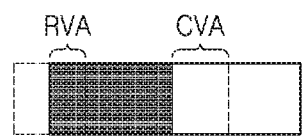
Figure 10B:

Operations S11 to S16 of FIG. 7 may be performed on each of a plurality of compressed data blocks. As a result, a packing direction corresponding to each of the plurality of compressed data blocks may be determined. As a reminder, when the FIG. 9 is a flowchart illustrating a method of determining a packing direction of an image processing apparatus according to an embodiment. FIG. 10A and FIG. 10B illustrate the number of memory accesses based on a packing environment. The method of FIG. 9 may be performed by the packing controller PC of FIG. 1.

Referring to FIG. 1 and FIG. 9, in operation S21, the packing controller PC may receive information about a packing environment. As shown in S21, the information about the packing environment received by the packing controller PC may include, for example, a size S_DB of a data block, an access unit AU for accessing the memory 150, a size S_CDB of a compressed data block, and a start address BA_AR (referred to also as a base address) of a storage area where the compressed data block is to be stored.

The packing controller PC may calculate, as a reference value RVA, a remainder value other than an integer (after subtracting or ignoring the integer) among a value obtained by dividing the size S_DB of the data block by the access unit AU in operation S22.

The packing controller PC may calculate an alignment location AL of the start address BA_AR based on a value obtained by dividing the start address BA_AR of the storage area by the access unit AU. For example, the packing controller PC may calculate, as the alignment location AL, a remainder value other than an integer (after subtracting or ignoring the integer) among the value obtained by dividing the start address BA_AR of the storage area by the access unit AU.

The packing controller PC may calculate, as a comparison value CVA, a remainder value other than an integer (after subtracting or ignoring the integer) among a value obtained by dividing the size S_CDB of the compressed data block by the access unit AU in operation S24. Operations S22 to S24 may be simultaneously calculated, or an order in which operations S22 to S24 are performed may be different than the order shown in FIG. 9.

Subsequently, in operation S25, the packing controller PC may determine whether the alignment location AL of the start address BA_AR matches a reference location of the memory 150. For example, when a value corresponding to the alignment location AL calculated in operation S24 is 0, the packing controller PC may determine that the alignment location AL matches the reference location of the memory 150. Otherwise, the packing controller PC may determine that the alignment location AL does not match the reference location of the memory 150.

When the alignment location AL of the start address BA_AR matches the reference location of the memory 150, the packing controller PC may determine whether the reference value RVA is equal to or greater than the comparison value CVA in operation S26. The result of comparison performed on the reference value RVA and the comparison value CVA may be used in determining the packing direction by the packing controller PC. When the reference value RVA is equal to or greater than the comparison value CVA (S26=Yes), the packing controller PC may determine a packing direction corresponding to the compressed data block as being to the right (on the right side) of the storage area in operation S27. When the reference value RVA is less than the comparison value CVA (S26=No), the packing controller PC may determine the packing direction corresponding to the compressed data block as being to the left (on the left side) of the storage area in operation S29.

When the alignment location AL of the start address BA_AR does not match the reference location of the memory 150, the packing controller PC may determine whether the reference value RVA is equal to or greater than the comparison value CVA in operation S28. When the reference value RVA is equal to or greater than the comparison value CVA (S28=Yes), the packing controller PC may determine the packing direction corresponding to the compressed data block as being to the left in operation S29. When the reference value RVA is less than the comparison value CVA (S28=No), the packing controller PC may determine the packing direction corresponding to the compressed data block as being to the right in operation S27.

Referring to FIG. 10A and FIG. 10B, a case where a reference value RVA is less than a comparison value CVA may be assumed. As illustrated in FIG. 10A, when an alignment location AL of a start address BA_AR matches a reference location of a memory, the number of memory accesses when a packing direction is to the left may be 2 and the number of memory accesses when the packing direction is to the right may be 3. Therefore, in a case where the alignment location AL of the start address BA_AR matches the reference location of the memory, when a reference value RVA is less than a comparison value CVA, the packing direction may be determined as being to the left, for reducing the number of memory accesses.

As illustrated in FIG. 10B, when an alignment location AL of a start address BA_AR matches a reference location of a memory, the number of memory accesses when a packing direction is to the left may be 3 and the number of memory accesses when the packing direction is to the right may be 2. Therefore, in a case where the alignment location AL of the start address BA_AR matches the reference location of the memory, when a reference value RVA is less than a comparison value CVA, the packing direction may be determined as being to the right, for reducing the number of memory accesses.

Referring again to FIG. 9, operations S21 to S29 of FIG. 9 may be performed on each of a plurality of compressed data blocks. As a result, a packing direction corresponding to each of the plurality of compressed data blocks may be determined.

Figure 11A:
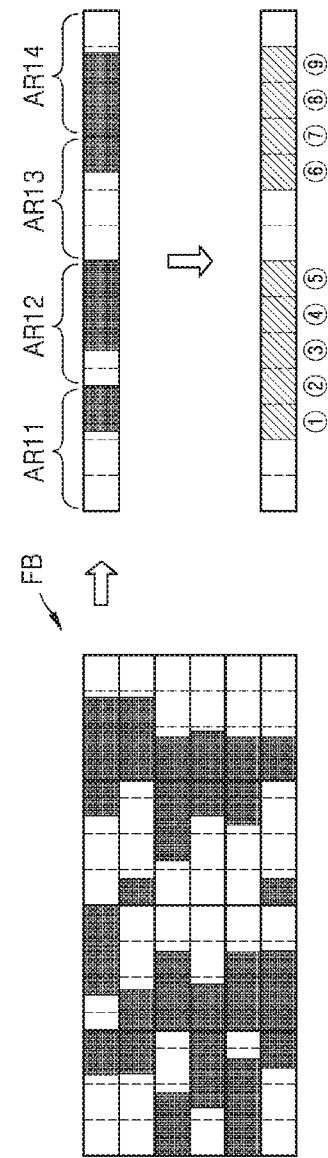
FIG. 11A illustrates the number of memory accesses based on a packing method according to an embodiment.
Figure 11B:
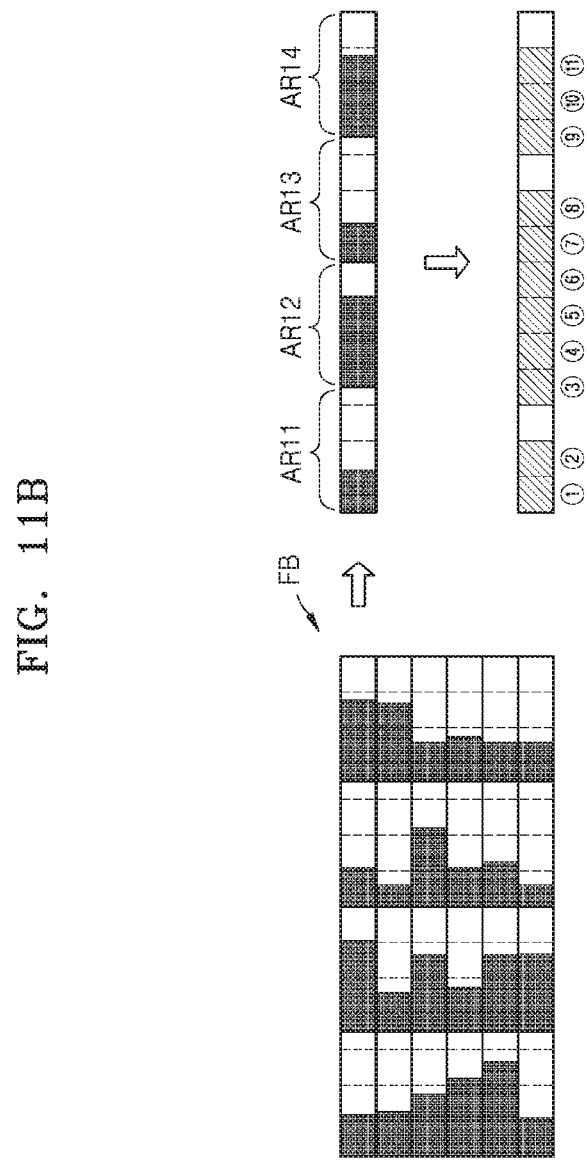
FIG. 11B illustrates the number of memory accesses based on a packing method of a comparative example.

FIG. 11A illustrates the number of memory accesses based on a packing method according to an embodiment. FIG. 11B illustrates the number of memory accesses based on a packing method of a comparative example.

Referring to FIG. 11A, in a case where a corresponding compressed data block is stored in each of a plurality of storage areas of a frame buffer FB based on the packing method according to an embodiment, the corresponding compressed data block may be selectively packed to the right (on the right side) or to the left (on the left side) of a corresponding storage area.

The frame buffer FB (i.e., a memory) may be accessed nine times so that compressed data blocks are packed in or read from a first row of the frame buffer FB. Also, as illustrated in FIG. 11A, in a case where a plurality of compressed data blocks are packed in the frame buffer FB, the frame buffer FB may be accessed forty-eight times for packing or reading all of the plurality of compressed data blocks.

Referring to FIG. 11B, in a case where a corresponding compressed data block is stored in each of a plurality of storage areas of a frame buffer FB based on the packing method of the comparative example, the corresponding compressed data block may be packed to the left of a corresponding storage area.

The frame buffer FB (i.e., a memory) may be accessed eleven times so that compressed data blocks are packed in or read from a first row of the frame buffer FB. Also, as illustrated in FIG. 11B, in a case where a plurality of compressed data blocks are packed in the frame buffer FB, the frame buffer FB may be accessed fifty-six times for packing or reading all of the plurality of compressed data blocks.

As described above, as a plurality of compressed data blocks are selectively packed to the right or to the left of a plurality of storage areas of a frame buffer FB based on the packing method according to an embodiment. As a result, the number of memory accesses for packing the plurality of compressed data blocks in the frame buffer FB and reading the plurality of compressed data blocks from the frame buffer FB may be reduced.

Figure 12A:
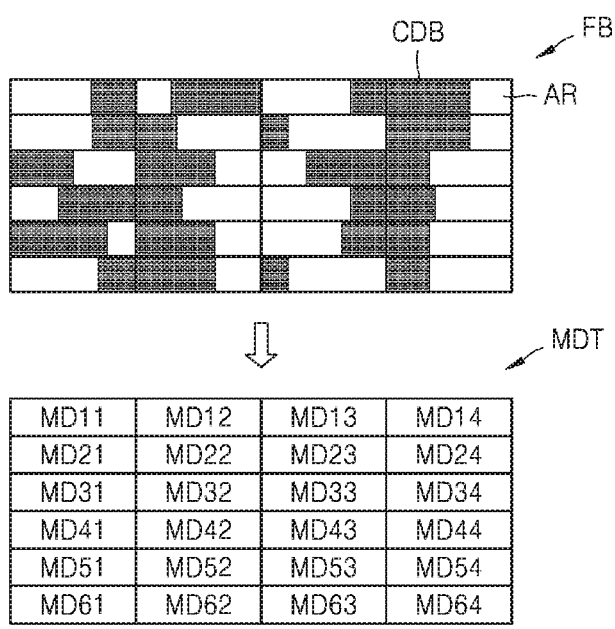
FIG. 12A illustrates metadata according to an embodiment.
Figure 12B:
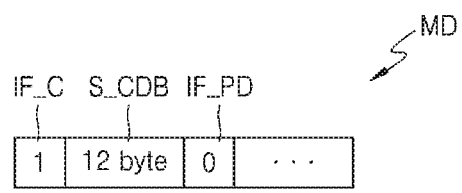
FIG. 12B illustrates information included in the metadata.

FIG. 12A illustrates metadata according to an embodiment, and FIG. 12B illustrates information included in the metadata.

Referring to FIG. 1 and FIG. 12A, the packing controller PC may generate metadata for managing a plurality of compressed data blocks CSB stored in a plurality of storage areas AR of a frame buffer FB. The packing controller PC may generate metadata of each of the plurality of compressed data blocks CSB and may store a plurality of metadata MD11 to MD64 of the plurality of compressed data blocks CSB. The packing controller PC may store a metadata table MDT, including the plurality of metadata MD11 to MD64, in the memory 150 or another memory and may read a compressed data block CDB from the frame buffer FB based on the metadata.

Referring to FIG. 12B, a metadata MD may include information IF_C representing the presence of compression, a data size S_CDB of a compressed data block CDB, and information IF_PD representing a packing direction. However, embodiments of the inventive concept(s) described herein are not limited thereto, and the metadata MD may further include other pieces of information.

For example, when the information IF_C representing the presence of compression is 1, this may represent that the compressed data block CDB is compressed. When the information IF_C representing the presence of compression is 0, this may represent that the compressed data block CDB is not compressed or a compression rate is 0.

When the information IF_PD representing the packing direction is 1, this may represent that the compressed data block CDB is packed to the right. When the information IF_PD representing the packing direction is 0, this may represent that the compressed data block CDB is packed to the left.

In an embodiment, the metadata MD may include a compression rate instead of the information IF_C representing the presence of compression and the data size S_CDB of the compressed data block CDB. The packing controller PC may calculate the presence of compression and the data size S_CDB of the compressed data block CDB based on the compression rate.

Figure 13:
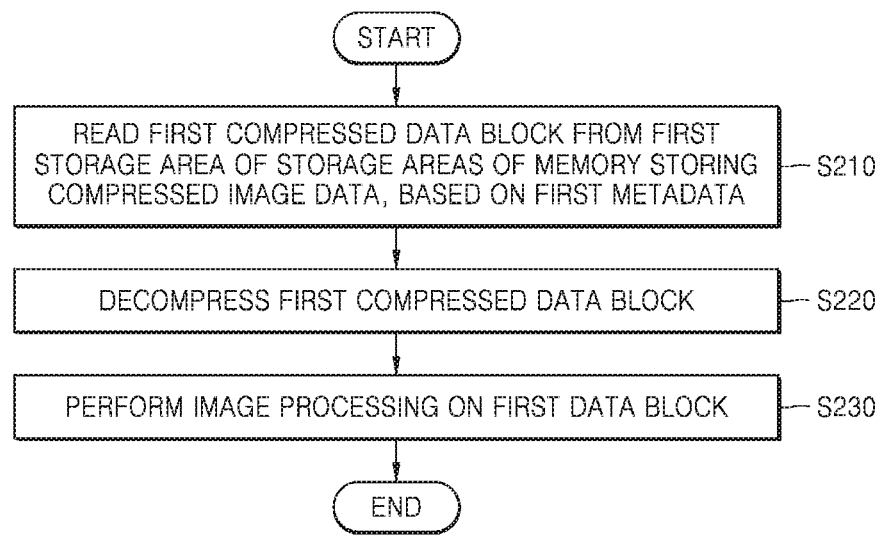
FIG. 13 illustrates an operating method of an image processing apparatus according to an embodiment.

FIG. 13 illustrates an operating method of an image processing apparatus according to an embodiment. FIG. 13 illustrates a method, performed by the image processing apparatus, of reading a portion of image data from a frame buffer. The method of FIG. 13 may be performed by the image processor 110 of FIG. 1, and the description given above with reference to FIG. 1 may be applied to the present embodiment.

Referring to FIG. 13, in operation S210, an image processor 110 may read a first compressed data block from a first storage area of a plurality of storage areas of a memory based on first metadata. For example, a packing processor PC may check the first metadata and a start address of the first storage area and may calculate a storage address with the first compressed data stored thereat, based on the start address, information IF_C, which is included in the first metadata and which represents the presence of compression, a data size S_CDB of a compressed data block CDB, and information IF_PD representing a packing direction. The packing controller PC may access the first storage area once or more by an access unit based on the storage address and the data size S_CDB of the compressed data block CDB, thereby reading the first compressed data block. When the right is selected as the packing direction, the packing processor PC may calculate a middle address of the storage area based on a size of the storage area, a size of the corresponding compressed data block, and the end address of the storage area.

In operation S220, the image processor 110 may decompress the first compressed data block. For example, a compressor CMP may decode the first compressed data block based on a predetermined mechanism (e.g., protocol, algorithm, standard) to decompress the first compressed data block. Therefore, a first data block may be generated.

In operation S230, the image processor 110 may perform image processing on the compressed first data block. For example, an image processing module included in the image processor 110 may perform the image processing. In an embodiment, the image processor 110 may provide the first data block to a display device.

As described above, the image processor 110 may randomly access a frame buffer FB based on metadata and a start address of each of a plurality of storage areas to read at least some or all of a plurality of compressed data blocks stored in the frame buffer FB.

Figure 14:
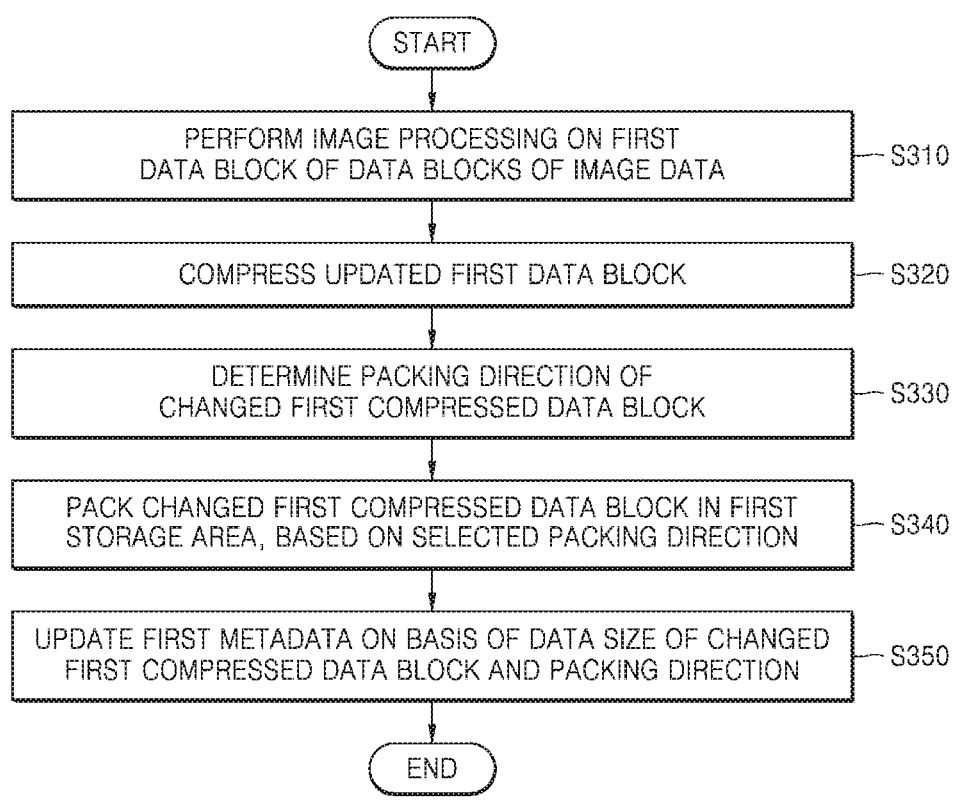
FIG. 14 illustrates an operating method of an image processing apparatus according to an embodiment.

FIG. 14 illustrates an operating method of an image processing apparatus according to an embodiment. FIG. 14 illustrates a method of updating, by the image processing apparatus, metadata and a data block stored in a frame buffer. The method of FIG. 14 may be performed by the image processor 110 of FIG. 1, and description given above with reference to FIG. 1 may be applied to the present embodiment.

Referring to FIG. 1 and FIG. 14, in operation S310, the image processor 110 may perform image processing on a first data block among a plurality of data blocks of image data IDT previously stored in the frame buffer FB. For example, as described above with reference to FIG. 13, the image processor 110 may read the first data block from the frame buffer FB to perform image processing on the first data block, or may perform image processing on a first data block which is received from the outside or generated internally or newly.

In operation S320, the image processor 110 may compress an updated first data block. For example, the compressor CMP may encode the updated first data block. Therefore, a first compressed data block may be generated. The first compressed data block may vary from a first compressed data block previously stored in the frame buffer FB. In order to differentiate the generated first compressed data block from the first compressed data block stored in the frame buffer FB, the first compressed data block generated in operation S320 may be referred to as a changed first compressed data block.

In operation S330, the image processor 110 may determine a packing direction corresponding to the changed first compressed data block. Accordingly, at S330 the process performed by the image processor 110 may include re-determining the packing direction as a re-determined packing direction based on the changed first compressed data block. For example, the packing controller PC may determine a packing direction based on the method described above with reference to FIG. 7 to FIG. 10B. Therefore, a repetitive description is omitted. The metadata may be updated based on the changed first compressed data block and the re-determined packing direction. Additionally, then changed first compressed-data block may be stored to the left or the right based on the re-determined packing direction.

In operation S340, the image processor 110 may pack the changed first compressed data block in a first storage area of the frame buffer FB based on the determined packing direction. In this case, the first storage area may be a storage area where the first compressed data block is stored, and by performing operation S340, the first compressed data block may be updated.

In operation S350, the image processor 110 may update first metadata corresponding to the first compressed data block based on a data size of the changed first compressed data block and the packing direction.

Figure 15:
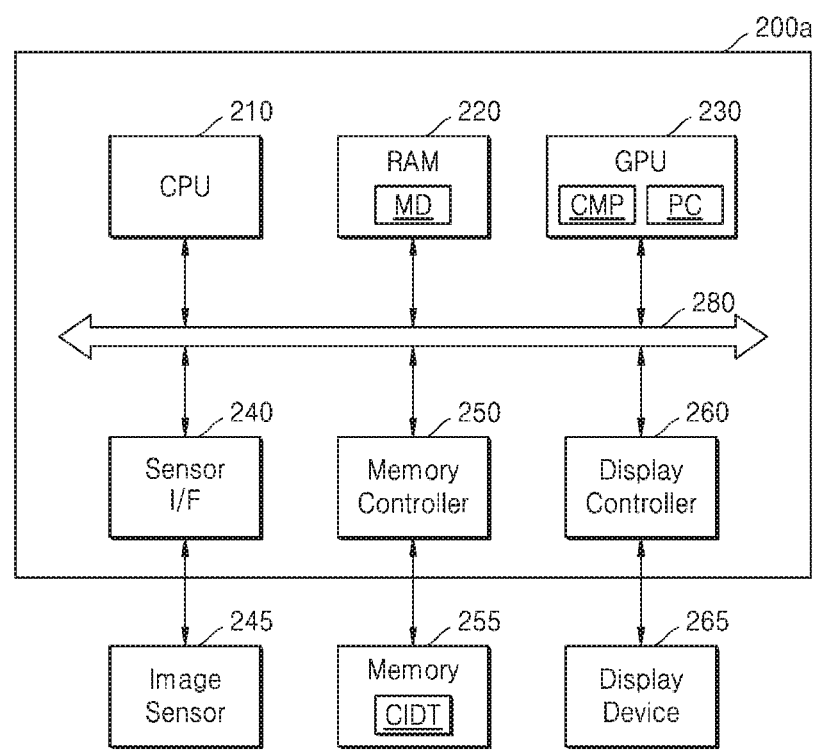
FIG. 15, FIG. 16, and FIG. 17 are block diagrams illustrating a system on chip according to embodiments.

FIG. 15 is a block diagram illustrating an SoC 200a according to an embodiment.

Referring to FIG. 15, the SoC 200a may include a CPU 210, RAM 220, a GPU 230, a sensor interface 240, a memory controller 250, and a display controller 260. The SoC 200a may further include other elements which are generally used like a communication module and ROM. The elements of the SoC 200a (for example, the CPU 210, the RAM 220, the GPU 230, the sensor interface 240, the memory controller 250, and the display controller 260) may transmit and receive data through a bus 280. A protocol of the bus 280 may use advanced microcontroller bus architecture (AMBA) protocol including advanced high-performance bus (AHB), advanced peripheral bus (APB), advanced eXtensible interface (AXI), AXI4, and AXI coherency extensions (ACE), and in addition, may use a protocol such as uNetwork, CoreConnect, or open core protocol of OCP-IP.

The CPU 210 may control an overall operation of the SoC 200a and may include one single core or a plurality of processor cores (multi-core). The CPU 210 may process or execute programs and/or data stored in the RAM 220 (or ROM).

The RAM 220 may be implemented as a memory such as DRAM or SRAM, and moreover, may be implemented as a resistive memory such as PRAM, MRAM, RRAM, or FRAM. The RAM 220 may temporarily store the programs, the data, and/or instructions. In an embodiment, the RAM 220 may store metadata MD. For example, a metadata table (MDT of FIG. 12A) including metadata corresponding to each of a plurality of compressed data blocks may be stored in the memory 255, and some or all metadata of the metadata table MDT may be loaded into the RAM 220.

The GPU 230 may perform image processing on image data (for example, a still image or a moving image). For example, the GPU 230 may perform image processing on image data received through the sensor interface 240 or image data received from the other elements among the internal elements of the SoC 200a.

The GPU 230 may store image-processed image data in the memory 255, or may provide the image-processed image data to the display device 265 through the display controller 260. The image processor 110 of FIG. 1 may be applied to the GPU 230. The GPU 230 may include a compressor CMP and a packing controller PC. Accordingly, the compressor CMP, the packing controller PC and the image processor 110 may be integrated into one semiconductor chip in the embodiment of FIG. 15. As described above with reference to FIG. 1 to FIG. 14, the GPU 230 may divide the image data into a plurality of data blocks, compress each of the plurality of data blocks to generate a plurality of compressed data blocks, and store the plurality of compressed data blocks in a frame buffer of the memory 255. The GPU 230 may determine a packing direction corresponding to each of the plurality of compressed data blocks and may pack each of the plurality of compressed data blocks in a corresponding storage area of the memory 255 based on the packing direction. Also, the GPU 230 may read all or some of the plurality of compressed data blocks stored in the memory 255 based on the metadata MD and may update the metadata MD while storing a changed compressed data block in the memory 255.

In an embodiment, the image processor 110 of FIG. 1 may be applied to another function module for performing image processing on image data, and for example, may be applied to the CPU 210 or the CPU 210 and the GPU 230.

The sensor interface 240 may interface data or a command between the SoC 200a and the image sensor 245 and may receive the image data from the image sensor 245.

The memory controller 250 may interface data or a command between the SoC 200a and the memory 255. As described above with reference to FIG. 1, the memory 255 may be implemented as a volatile memory such as DRAM or SRAM, or may be implemented as a non-volatile memory such as resistive random access memory (ReRAM), PRAM, or NAND flash memory. The memory 255 may be implemented as a memory card (for example, a multimedia card (MMC), an embedded multi-media card (eMMC), a secure digital (SD) card, or a micro SD card). The memory 255 may operate as a frame buffer and may store compressed image data CIDT. The compressed image data CIDT may be stored based on the packing method according to embodiments described above with reference to FIG. 1 to FIG. 14. Also, the memory 255 may store the metadata MD.

The display controller 260 may interface data (for example, image data) output to the display device 265. The display device 265 may display data of an image or a moving image through a display such as a liquid crystal display (LCD) or an active matrix organic light emitting diode (AMOLED) display.

As described above, in compressing the image data and storing the compressed image data CIDT in the memory 255, the packing controller PC may determine a packing direction corresponding to each of the plurality of compressed data blocks and may pack a compressed data block in a corresponding storage area based on the packing direction, thereby decreasing the number of accesses of the memory 255. Therefore, a number of accesses of the memory 255 may be reduced, an operating speed of each of the SoC 200a and an image processing apparatus including the SoC 200a may increase, and power consumption may decrease.

Figure 16:
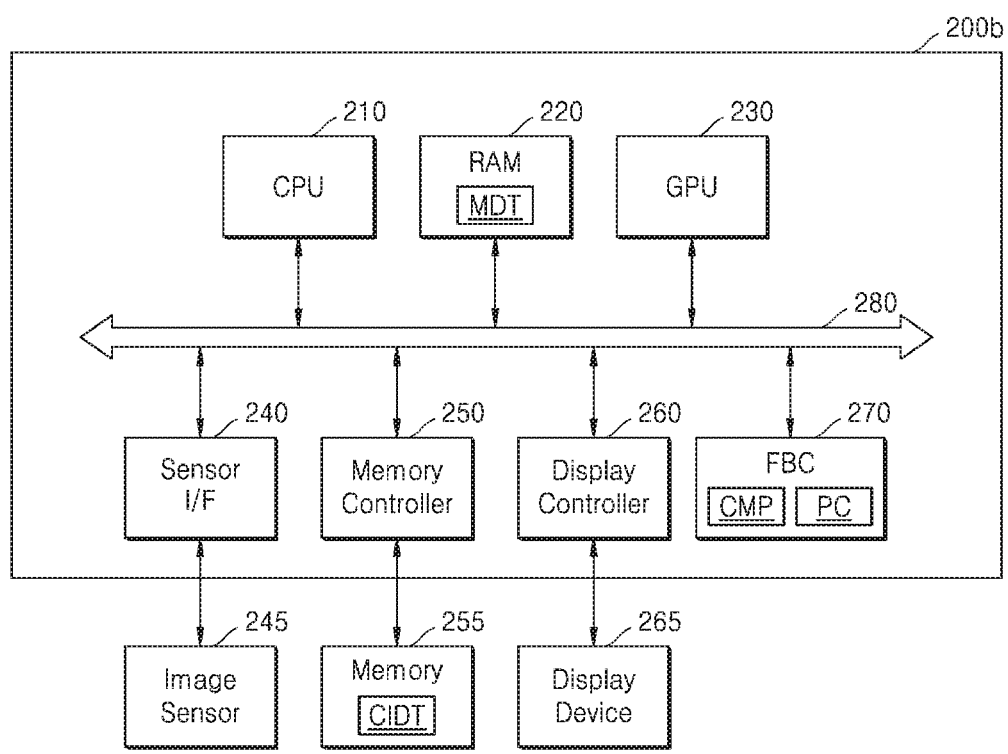

FIG. 16 is a block diagram illustrating an SoC 200b according to an embodiment.

Referring to FIG. 16, the SoC 200b may include a CPU 210, RAM 220, a GPU 230, a sensor interface 240, a memory controller 250, a display controller 260, and a frame buffer compression module 270. The elements (for example, the CPU 210, the RAM 220, the GPU 230, the sensor interface 240, the memory controller 250, the display controller 260, and the frame buffer compression module 270) of the SoC 200b may transmit and receive data through a bus 280.

The configuration and operation of the SoC 200b of FIG. 16 may be similar to those of the SoC 200a of FIG. 15. Comparing with the SoC 200a of FIG. 15, the SoC 200b may separately include the frame buffer compression module 270 including a compressor CMP and a packing controller PC. Accordingly, the compressor CMP, the packing controller PC and an image processor may be integrated into one semiconductor chip in the embodiment of FIG. 16, though here the compressor CMP and the packing controller PC are included in the frame buffer compression module 270 rather than in an image processor.

In FIG. 16, a processor (for example, the CPU 210 and the GPU 230) for performing image processing may store image data in the memory 255, or when reading stored image data from the memory 255, the image data may be compressed (or decompressed) and packed based on the packing method described above with reference to FIG. 1 to FIG. 14.

Figure 17:
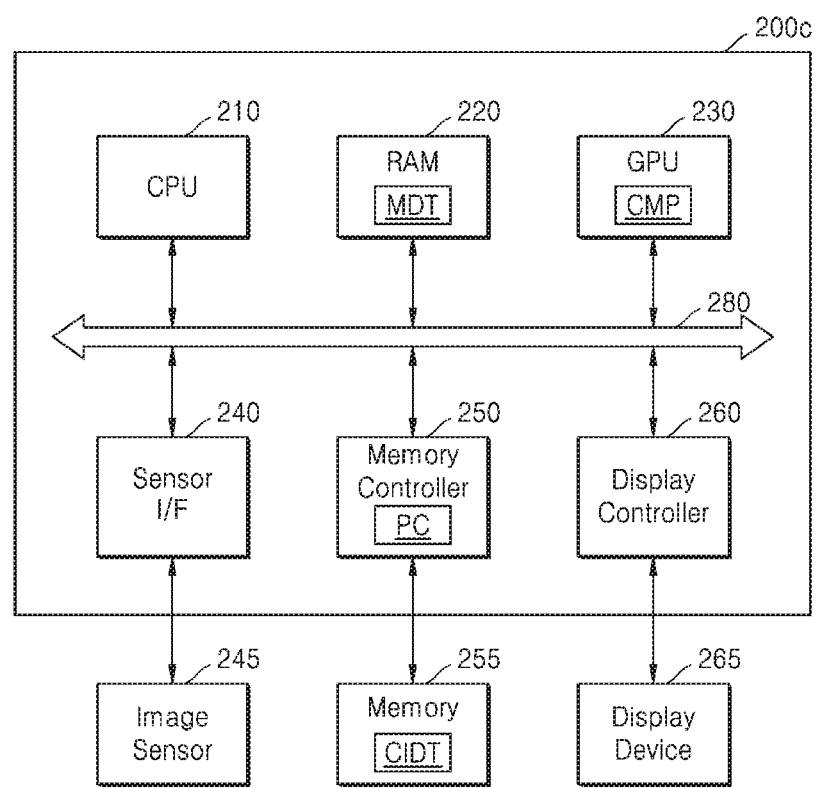

FIG. 17 is a block diagram illustrating an SoC 200c according to an embodiment.

Referring to FIG. 17, the SoC 200c may include a CPU 210, RAM 220, a GPU 230, a sensor interface 240, a memory controller 250, and a display controller 260. The elements (for example, the CPU 210, the RAM 220, the GPU 230, the sensor interface 240, the memory controller 250, and the display controller 260) of the SoC 200c may transmit and receive data through a bus 280.

The configuration and operation of the SoC 200c of FIG. 17 may be similar to those of the SoC 200a of FIG. 15. In the present embodiment, a packing controller PC may be included in the memory controller 250. A compressor CMP for compressing image data may be included in the GPU 230, or may be included in a function module (for example, the CPU 210) for performing image processing.

The memory controller 250 may determine a packing direction corresponding to each of a plurality of compressed data blocks received and may pack each of the plurality of compressed data blocks in a corresponding storage area of the memory 255 based on the determined packing direction. Accordingly, the compressor CMP, the packing controller PC and an image processor may be integrated into one semiconductor chip in the embodiment of FIG. 17, though here the packing controller PC may be included in the memory controller 250, and the compressor CMP may be included in the GUP 230 or in the image processor.

The embodiments may be represented by using function modules and various operations. Such function modules may be implemented with a number of hardware or/and software elements for performing specified functions. For example, the embodiments may apply integrated circuit elements (for example, a memory, a processing element, a logic element, a look-up table) for performing various functions based on control by one or more microprocessors or control by other control devices. Like that elements are executed as software programming or software elements, the embodiments may be implemented with a programming or scripting language such as C, C++, Java, assembler, or the like, in addition to various algorithms implemented as data structures, processes, routines, or a combination of other programming elements. Functional aspects may be implemented with an algorithm executed by one or more processors. Also, the embodiments may use the relate art, for electronic environment configuration, signal processing, and/or data processing.

While aspects of the inventive concept(s) described herein have been particularly shown and described with reference to embodiments thereof, it will be understood that various changes in form and details may be made therein without departing from the spirit and scope of the following claims.

What is claimed is:

1. An operating method of an image processor, the operating method comprising:
   dividing image data into a plurality of data blocks;
   compressing each of the plurality of data blocks into a plurality of compressed data blocks;
   for each of the plurality of compressed data blocks, determining a packing direction as a determined packing direction, in which the corresponding compressed data block is to be stored, based on a data size of the corresponding compressed data block and a start address of a storage area where the corresponding compressed data block is to be stored among a plurality of storage areas of a memory; and
   packing each of the plurality of compressed data blocks in a corresponding storage area among the plurality of storage areas of the memory based on the determined packing direction for the corresponding compressed data block.

2. The operating method of claim 1, wherein the packing comprises:
   when a first direction is selected as the packing direction, storing the corresponding compressed data block from the start address of the storage area; and
   when a second direction opposite the first direction is selected as the packing direction, storing the corresponding compressed data block from a middle address of the storage area to an end address of the storage area.

3. The operating method of claim 2, wherein the packing comprises:
   transmitting the start address or the middle address to the memory based on the packing direction; and
   when the second direction is selected as the packing direction, calculating the middle address based on a size of the storage area, a size of the corresponding compressed data block, and the start address of the storage area.

4. The operating method of claim 1, wherein the determining of the packing direction comprises, when the corresponding compressed data block is packed in the storage area in a determined packing direction among a second direction and a first direction opposite the second direction, determining a direction, in which a number of accesses of the memory based on an access unit of the memory is relatively small, as the packing direction.

5. The operating method of claim 1, wherein the determining of the packing direction comprises:
   calculating a number of accesses of the memory needed when packing the corresponding compressed data block to a second side in the storage area and packing the corresponding compressed data block to a first side opposite the second side in the storage area, based on an access unit of the memory;
   comparing a first number corresponding to the first side with a second number corresponding to the second side; and
   selecting the packing direction from among the first side and the second side based on a result of the comparing.

6. The operating method of claim 1, wherein the determining of the packing direction comprises:
   calculating, as a reference value, a remainder other than an integer among a first value obtained by dividing a corresponding compressed data block by an access unit of the memory;
   calculating, as a comparison value, a remainder other than an integer among a second value obtained by dividing the corresponding compressed data block by the access unit;
   determining an alignment location of the start address of the storage area in the memory based on the access unit; and
   determining the packing direction based on the alignment location of the start address and a result of a comparison performed on the reference value and the comparison value.

7. The operating method of claim 6, wherein the determining of the packing direction based on the alignment location of the start address and the result of the comparison comprises:
   determining whether the alignment location of the start address corresponds to a reference location of the memory based on the access unit;
   determining whether the reference value is equal to or greater than the comparison value; and
   determining one of a first direction or a second direction opposite the first direction as the packing direction when the alignment location corresponds to the reference locations and the reference value is equal to or greater than the comparison value and when the alignment location does not correspond to the reference locations and the reference value is less than the comparison value.

8. The operating method of claim 1, further comprising predetermining a start address of each of the plurality of storage areas based on a size of the image data and a size of each of the plurality of data blocks.

9. The operating method of claim 1, further comprising generating metadata, including information about the packing direction and the data size, of each of the plurality of compressed data blocks.

10. The operating method of claim 1, further comprising:
   reading a first compressed data block based on first metadata of the first compressed data block and a first start address of a first storage area, where the first compressed data block is packed, of the plurality of storage areas;
   decompressing the first compressed data block into a decompressed first data block; and
   performing image processing on the decompressed first data block.

11. The operating method of claim 10, further comprising:
generating a second data block by performing image processing on the decompressed first data block;
compressing the second data block to generate a second compressed data block;
determining a packing direction of the second compressed data block as a determined packing direction of the second compressed data block based on a data size of the second compressed data block and the first start address;
packing the second compressed data block in the first storage area based on the packing direction; and
updating the first metadata based on the data size of the second compressed data block and the packing direction.

12. An operating method of an image processing apparatus including a memory and an image processor, the operating method comprising:
compressing, by the image processor, a first data block of a plurality of data blocks included in image data to generate a first compressed data block;
determining, by the image processor, a packing direction of the first compressed data block based on a data size of the first compressed data block and a start address of a first storage area allocated for the first compressed data block among a plurality of storage areas of the memory; and
storing, by the memory, the first compressed data block to a first side in the first storage area or to a second side opposite the first side in the first storage area based on the packing direction.

13. The operating method of claim 12, wherein the determining of the packing direction comprises determining the packing direction based on a number of accesses of the memory needed when packing the first compressed data block to the second side of the first storage area and packing the first compressed data block to the first side opposite the second side of the first storage area.

14. The operating method of claim 12, wherein the determining of the packing direction comprises:
calculating, as a reference value, a remainder other than an integer among a first value obtained by dividing the first data block by an access unit of the memory;
calculating, as a comparison value, a remainder other than an integer among a second value obtained by dividing the first compressed data block by the access unit;
determining an alignment location of the start address of the first storage area in the memory based on the access unit; and
determining the packing direction based on the alignment location of the start address and a result of comparison performed on the reference value and the comparison value.

15. The operating method of claim 14, wherein the determining of the packing direction comprises determining a direction of the second side as the packing direction when the alignment location corresponds to reference locations and the reference value is equal to or greater than the comparison value and when the alignment location does not correspond to the reference locations and the reference value is less than the comparison value.

16. The operating method of claim 12, further comprising generating metadata, including information about the packing direction and the data size, of the first compressed data block by using the image processor.

17. The operating method of claim 16, further comprising randomly accessing, by the image processor, the first storage area of the memory based on the metadata and a start address of the first storage area to read the first compressed data block.

18. The operating method of claim 16, further comprising:
when the first data block is changed, compressing a changed first data block to generate a changed first compressed data block by using the image processor;
re-determining, by the image processor, the packing direction based on the changed first compressed data block;
updating, by the image processor, the metadata based on the changed first compressed data block and a re-determined packing direction; and
storing, by the memory, the changed first compressed data block to the first side or to the second side opposite the first side of the first storage area based on the re-determined packing direction.

19. An image processing apparatus, comprising:
a compressor configured to divide image data into a plurality of data blocks and compress the plurality of data blocks into a corresponding plurality of compressed data blocks; and
a packing controller configured to write each of the plurality of compressed data blocks in a corresponding storage area of a plurality of storage areas in a memory and to determine a packing direction as a determined packing direction so that a corresponding compressed data block is packed in the determined packing direction to a first side in the corresponding storage area or to a second side in the corresponding storage area, based on a data size of the corresponding compressed data block and a start address of the corresponding storage area where the corresponding compressed data block is to be stored.

20. The image processing apparatus of claim 19, further comprising an image processor configured to perform image processing on the image data.

* * * * *